(12) United States Patent
Campos et al.

(10) Patent No.: US 12,200,880 B2
(45) Date of Patent: Jan. 14, 2025

(54) ARC RESISTANT SYSTEM AND METHOD FOR VENTILATION OF ELECTRICAL EQUIPMENT

(71) Applicant: TOSHIBA INTERNATIONAL CORPORATION, Houston, TX (US)

(72) Inventors: Walter Campos, Houston, TX (US); Mike Daskalos, Magnolia, TX (US); Enrique Martinez, Cypress, TX (US)

(73) Assignee: Toshiba International Corporation, Houston, TX (US)

( * ) Notice: Subject to any disclaimer, the term of this patent is extended or adjusted under 35 U.S.C. 154(b) by 213 days.

(21) Appl. No.: 17/968,484

(22) Filed: Oct. 18, 2022

(65) Prior Publication Data

US 2024/0130057 A1   Apr. 18, 2024

(51) Int. Cl.
*H05K 5/02* (2006.01)
*H05K 7/20* (2006.01)

(52) U.S. Cl.
CPC ......... *H05K 5/0213* (2013.01); *H05K 5/0217* (2013.01); *H05K 7/20145* (2013.01)

(58) Field of Classification Search
CPC ..... H05K 7/20; H05K 7/20136–20145; H05K 7/154; H05K 7/172; H05K 7/181; H05K 7/2019; H05K 7/20209; H05K 7/20718; H05K 7/20736; H05K 5/00; H05K 5/02; H05K 5/0213; H01L 23/34; H01L 23/367; H01L 23/3675; H01L 23/46–467; F04D 25/08; F04D 25/12; F04D 25/14; F04D 29/626; F04D 29/646; F24F 7/00; F24F 7/007; F24F 13/00; F24F 13/10; F24F 13/14; F24F 13/20; F24F 11/00; F24F 11/30; F25D 2323/00284; G03G 2221/1645; G06F 1/20; G06F 1/206; B60H 1/00864; B60H 1/26; B60H 1/3421; H02B 1/14; H02B 1/565; H02B 11/24

See application file for complete search history.

(56) References Cited

U.S. PATENT DOCUMENTS 4,478,048 A * 10/1984 Dills ................. F24F 11/52
165/223
4,860,163 A * 8/1989 Sarath ............... H05K 7/20563
361/796

(Continued)

FOREIGN PATENT DOCUMENTS

KR      101512409 B1 *  4/2015
WO   WO-2022083862 A1 *  4/2022 ............. B60H 1/249

OTHER PUBLICATIONS

KR-101512409-B1 English Translation (Year: 2015).*

*Primary Examiner* — Amir A Jalali
(74) *Attorney, Agent, or Firm* — Baker Botts L.L.P.

(57) ABSTRACT

A ventilation system for an electrical equipment enclosure is provided. The ventilation system includes a first vent disposed at an interior of the enclosure; a second vent disposed at an exterior of the enclosure and located away from the first vent along an air flow path, which may be circuitous; at least one inner shutter held in an open position with respect to the first vent; and at least one outer shutter held in an open position with respect to the second vent; the at least one inner shutter and the at least one outer shutter each being configured to automatically transition from an open position to a closed position in response to air pressure increase.

19 Claims, 7 Drawing Sheets

(56) References Cited

U.S. PATENT DOCUMENTS

| | | | | |
|---|---|---|---|---|
| 5,564,626 | A * | 10/1996 | Kettler | F24F 8/10 55/471 |
| 8,096,862 | B1 * | 1/2012 | Demster | F24F 13/14 454/238 |
| 9,609,769 | B2 * | 3/2017 | Kingston | H01H 9/342 |
| 2010/0263830 | A1 * | 10/2010 | Noteboom | H05K 7/2079 165/80.2 |
| 2012/0148387 | A1 * | 6/2012 | Labrecque | F24F 13/1426 415/148 |
| 2012/0149294 | A1 * | 6/2012 | Labrecque | A01K 1/0064 454/353 |
| 2014/0287675 | A1 * | 9/2014 | Labrecque | F04D 25/14 454/259 |
| 2014/0340842 | A1 * | 11/2014 | Towner | H05K 7/20309 165/104.34 |
| 2017/0063052 | A1 * | 3/2017 | Johnson | H02B 1/30 |
| 2017/0069923 | A1 * | 3/2017 | Trevisan | H01M 8/0687 |
| 2020/0083677 | A1 * | 3/2020 | Kleinecke | H02B 1/565 |
| 2020/0284464 | A1 * | 9/2020 | Abdel-Salam et al. | F24F 3/06 |
| 2020/0393143 | A1 * | 12/2020 | Shaffer | F24F 13/20 |
| 2021/0243920 | A1 * | 8/2021 | Inamasa | H05K 7/20909 |
| 2021/0378151 | A1 * | 12/2021 | Gao | H05K 7/20745 |

\* cited by examiner

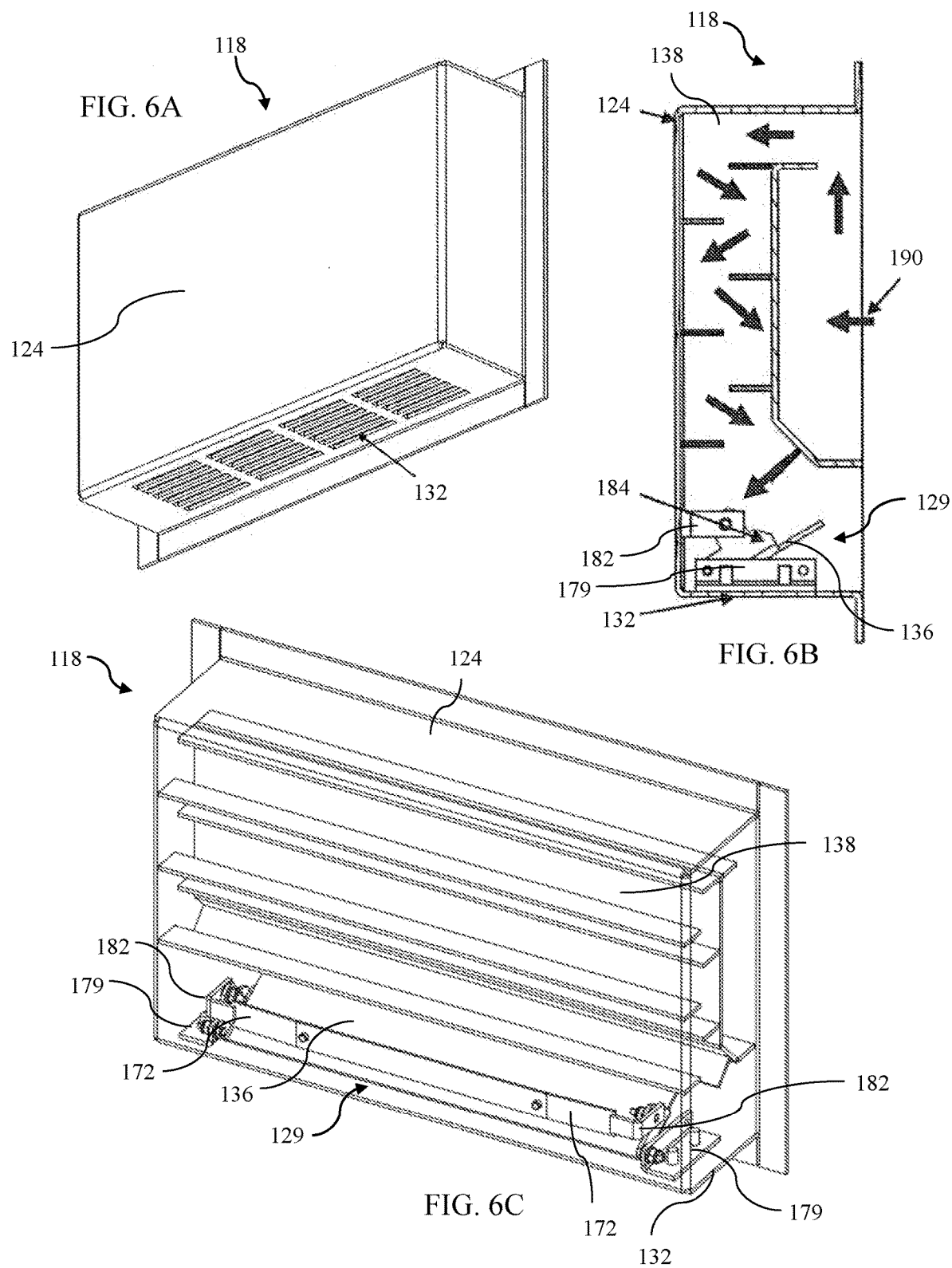

ARC RESISTANT SYSTEM AND METHOD FOR VENTILATION OF ELECTRICAL EQUIPMENT

TECHNICAL FIELD

Embodiments of the present disclosure relate to electrical systems and enclosures and, more particularly, to arc resistant systems and methods that allow for ventilation of such systems.

BACKGROUND

Electrical systems such as, for example, medium and high voltage drives, motor control centers, and switchgear are susceptible to internal arc faults. These electrical systems are generally installed in enclosures. The enclosures help to protect the electrical systems from external conditions such as dust, debris, weather conditions, etc. In addition, the enclosures help to contain and/or redirect internal conditions associated with the electrical systems. For example, arc fault or arc flash in an enclosure can produce large amounts of high temperature and high pressure gases that may be ejected by the affected electrical system. Such arc fault or arc flash, if not redirected, can cause damage to electrical equipment leading to inefficient operation of the electrical system. For example, uncontrolled release of arc gas out from medium voltage equipment during normal operation may cause damage to exhaust assemblies and injure nearby personnel. Thus, it is desirable to contain and redirect harmful arc gas to a proper ventilation area.

Electrical systems generally require ventilation during normal operations, which can be provided by intake vents built into the enclosure. However, such intake vents can provide a path through which high pressure arc gases may escape the enclosure and cause damage to equipment or injury to nearby personnel.

It is now recognized that a need exists for electrical equipment ventilation systems and methods that are capable of containing and redirecting effects from an internal arc fault.

SUMMARY

In accordance with an aspect of the present disclosure, a ventilation system for an electrical equipment enclosure includes: a first vent disposed at an interior of the enclosure; a second vent disposed at an exterior of the enclosure and located away from the first vent along an air flow path; at least one inner shutter held in an open position with respect to the first vent; and at least one outer shutter held in an open position with respect to the second vent; the at least one inner shutter and the at least one outer shutter each being configured to automatically transition from an open position to a closed position in response to air pressure increase.

In accordance with another aspect of the present disclosure, an electrical equipment system includes: an enclosure; electrical equipment contained in the enclosure; a first vent disposed at an interior of the enclosure; a second vent disposed at an exterior of the enclosure and located away from the first vent along an air flow path; at least one inner shutter held in an open position with respect to the first vent; and at least one outer shutter held in an open position with respect to the second vent; the at least one inner shutter and the at least one outer shutter each being configured to automatically transition from an open position to a closed position in response to air pressure increase.

In accordance with another aspect of the present disclosure, a method includes: providing a ventilation system for an electrical equipment enclosure, the ventilation system including: a first vent disposed at an interior of the enclosure; a second vent disposed at an exterior of the enclosure and located away from the first vent along an air flow path; at least one inner shutter held in an open position with respect to the first vent; and at least one outer shutter held in an open position with respect to the second vent; and maintaining the at least one inner shutter in the open position and the at least one outer shutter in the open position to vent the electrical cabinet.

BRIEF DESCRIPTION OF THE DRAWINGS

For a more complete understanding of the present disclosure and its features and advantages, reference is now made to the following description, taken in conjunction with the accompanying drawings, in which:

FIGS. 6A-6C are perspective, side cutaway, and partially transparent perspective views, respectively, of an outer vent assembly of the ventilation system of FIGS. 4A and 4B, in accordance with an embodiment of the present disclosure.

DETAILED DESCRIPTION

Illustrative embodiments of the present disclosure are described in detail herein. In the interest of clarity, not all features of an actual implementation are described in this specification. It will of course be appreciated that in the development of any such actual embodiment, numerous implementation specific decisions must be made to achieve developers' specific goals, such as compliance with system related and business related constraints, which will vary from one implementation to another. Moreover, it will be appreciated that such a development effort might be complex and time consuming, but would nevertheless be a routine undertaking for those of ordinary skill in the art having the benefit of the present disclosure. Furthermore, in no way should the following examples be read to limit, or define, the scope of the disclosure.

Disclosed embodiments are directed to ventilation systems and methods that may be used to vent enclosures holding electrical equipment and are capable of redirecting arc gas in the event of an internal arc fault. During normal operations, the ventilation system remains open to allow airflow into the enclosure for cooling the electrical equipment. In the event of an internal arc fault, however, the ventilation system transitions from open to closed, thereby blocking heated arc gas from exiting through the vent and injuring any nearby users and containing the high temperature gases and flames from the arc. The disclosed ventilation system includes at least a pair of redundant shutters and associated vent openings, with the shutters being configured to close in the event of an internal arc fault. In certain embodiments, the disclosed ventilation system may also include an air flow path formed between the first shutter and the second shutter that provides an elongated escape path for the effects caused by the arc event. The disclosed ventilation systems and methods help with ventilation required on electrical equipment, such as medium voltage controllers, switchgear, and drives, while maintaining the arc resistant ratings of the cabinets holding the electrical equipment.

Figure 1A:
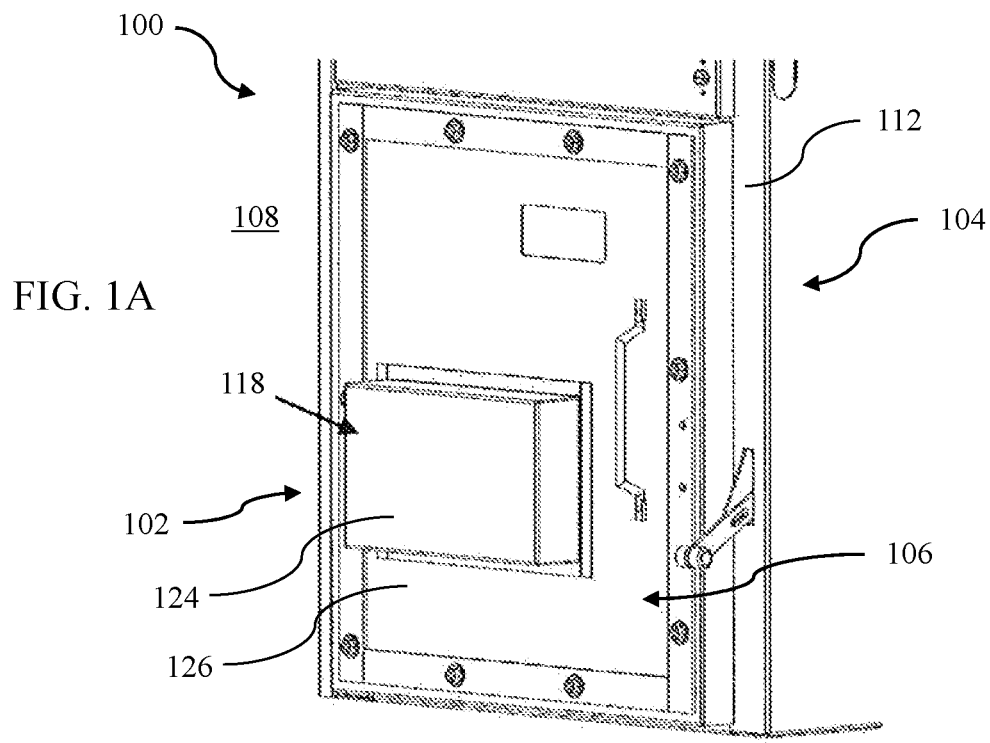
FIGS. 1A and 1B are perspective views of a door of an enclosure housing electrical equipment, in accordance with an embodiment of the present disclosure.
Figure 1B:
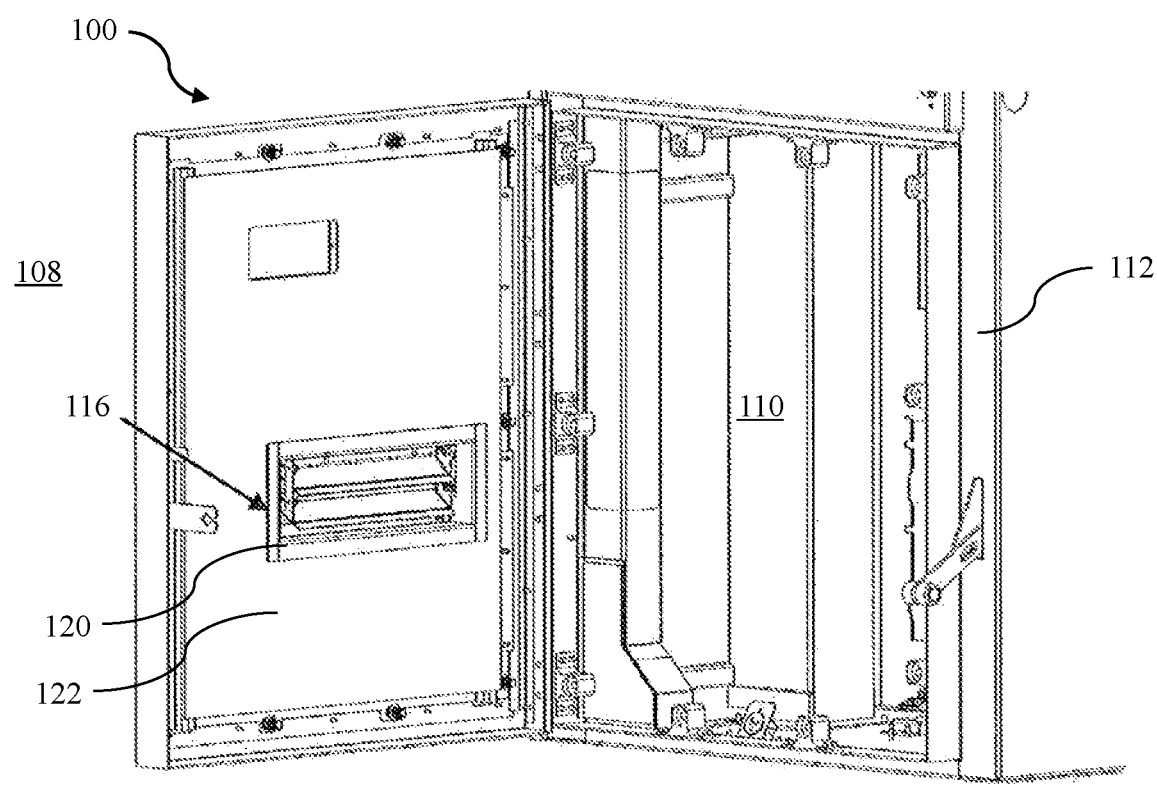

Turning now to the drawings, FIGS. 1A and 1B depict a system 100 including a ventilation system 102 in accordance with the present disclosure. The ventilation system 102 is incorporated into an enclosure 104 containing electrical equipment (not shown). The enclosure 104 may be an enclosure for various power components, which may form part of, for example, a medium-voltage control center, switchgear, or adjustable speed drive. Power components contained in the enclosure 104 may be used for other functions as well. The ventilation system 102 is configured to enable air flow (i.e., provide ventilation) into the enclosure 104, so as to provide cooling for the electrical equipment in the enclosure 104. The enclosure 104 with the ventilation system 102 is designed to be arc resistant.

As illustrated, the system 100 may include the enclosure 104 and a door 106 of the enclosure 104, with the ventilation system 102 being built into or otherwise disposed on the door 106. It should be understood that, in other embodiments, the ventilation system 102 may be built into or otherwise disposed on any other outer structure (e.g., a wall) of the enclosure 104 to provide ventilation to the electrical equipment within the enclosure 104. In any case, the ventilation system 102 may be disposed such that one side of the ventilation system 102 is open to an exterior 108 of the enclosure 104 while the other side of the ventilation system 102 is open to an interior 110 of the enclosure 104.

The enclosure 104 may include a wall 112 on which the door 106 is located. In an example, the door 106 may be a hinged door rotatably attached to the wall 112 via a hinge (not visible). In another example, the door 106 may be a removable cover that can be selectively removed from the wall 112. In such instances, the door 106 may not feature a hinge. In general, the door 106 is selectively movable with respect to the wall 112 of the enclosure 104 to provide an access point to the interior of the enclosure 104. Incorporating the ventilation system 102 into a door 106 as shown may facilitate easy installation of the ventilation system 102 into existing enclosures.

The ventilation system 102 may generally include an inner vent assembly 116 and an outer vent assembly 118 through which air flow is allowed to vent the enclosure 104. The inner vent assembly 116 may include an inner housing 120 mounted to an interior surface 122 of the enclosure 104. As discussed below, the inner housing 120 may have a first vent ("inner vent"), and at least one inner shutter is located inside the inner housing 120. As such, in the illustrated embodiment, the inner vent of the ventilation system 102 is disposed at an interior of the door 106. The outer vent assembly 118 may include an outer housing 124 mounted to an exterior surface 126 of the enclosure 104. As discussed below, the outer housing 124 may have a second vent ("outer vent"), and at least one outer shutter is located inside the outer housing 124. As such, in the illustrated embodiment, the outer vent of the ventilation system 102 is disposed at an exterior of the door 106.

Figure 2A:
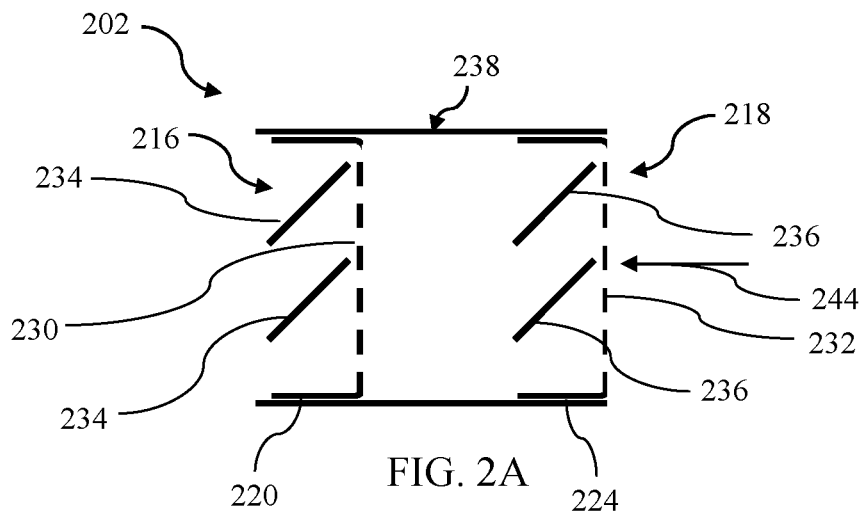
FIGS. 2A and 2B are schematic diagrams illustrating the operation of a ventilation system having two shutter assemblies, in accordance with an embodiment of the present disclosure.
Figure 2B:
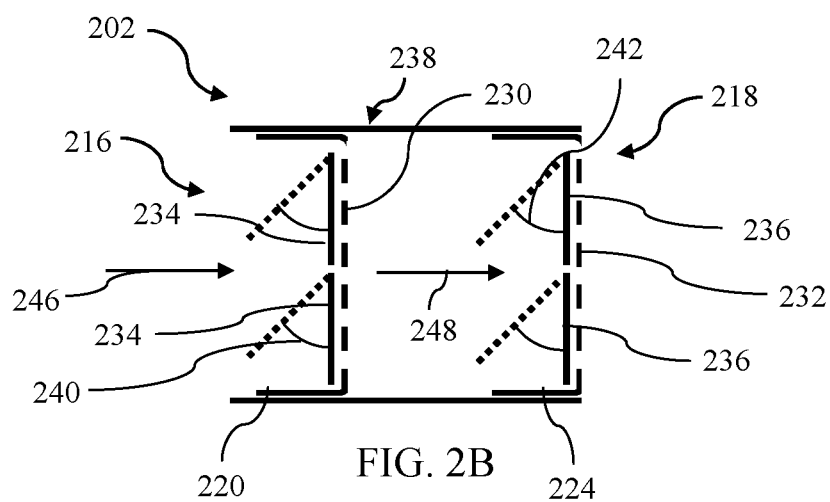

FIGS. 2A and 2B are simplified diagrams showing the basic structure and function of a ventilation system 202 in accordance with the present disclosure. As discussed above, the ventilation system 202 may be used for an electrical equipment enclosure (e.g., 104 of FIG. 1). The ventilation system 202 includes an inner vent assembly 216, which is located at the interior of an enclosure, and an outer vent assembly 218, which is located at the exterior of the enclosure. The inner vent assembly 216 generally includes a first vent 230 ("inner vent") and at least one inner shutter 234, and the outer vent assembly 218 generally includes a second vent 232 ("outer vent") and at least one outer shutter 236. The inner vent 230 may be disposed at an interior (e.g., 122 of FIG. 1) of an enclosure (e.g., 104 of FIG. 1), while the outer vent 232 is disposed at an exterior (e.g., 126 of FIG. 1) of the enclosure. As shown, the outer vent 232 is located away from the inner vent 230 along an air flow path 238 of the ventilation system 202.

The inner vent 230 may include a plate, wall, or similar surface having one or more openings therein to enable airflow from one side of the inner vent 230 to the other. The plate, wall, or similar surface having the inner vent 230 may form a portion of an inner housing 220, which is similar to the inner housing 120 described above with reference to FIG. 1. The outer vent 232 may include a plate, wall, or similar surface having one or more openings therein to enable airflow from one side of the outer vent 232 to the other. The plate, wall, or similar surface having the outer vent 232 may form a portion of an outer housing 224, which is similar to the outer housing 124 described above with reference to FIG. 1. Although the air flow path 238 is illustrated in FIGS. 2A and 2B as being a separate structure from the inner housing 220 and the outer housing 224, in other embodiments the air flow path 238 may be built into one or both of the inner housing 220 and the outer housing 224.

The one or more openings in each of the inner vent 230 and the outer vent 232 may include through-holes, elongated slots, or a combination thereof. The one or more openings extend all the way through the plate, wall or similar surface in which the vent is formed. As such, the inner vent 230 and the outer vent 232 comprise vent grills. The one or more openings may, in some embodiments, include louvers formed thereon to provide additional protection against moisture, dust, debris, foreign objects, and/or pollution that might otherwise undesirably enter the enclosure through the vent. If louvers are present, these may be positioned such that the angled faces of the louvers face a direction away from the corresponding shutter(s) adjacent the vent, allowing the shutter(s) to fully close over the vent.

The one or more inner shutter(s) 234 may form part of an inner shutter plate assembly, which is described in detail below. The one or more outer shutter(s) 236 likewise may form part of an outer shutter plate assembly, which is described in detail below. Each shutter 234, 236 may comprise a horizontally oriented shutter plate. The inner shutter(s) 234 may comprise a single shutter plate, or multiple (e.g., 2, 3, 4, 5, 6, 7, 8, or more) shutter plates oriented substantially parallel to each other. The outer shutter(s) 236 may comprise a single shutter plate, or multiple (e.g., 2, 3, 4, 5, 6, 7, 8, or more) shutter plates oriented substantially parallel to each other.

FIG. 2A illustrates the inner shutter(s) 234 held in an open position with respect to the inner vent 230, and the outer shutter(s) 236 held in an open position with respect to the outer vent 232. In their respective open positions, the shutter(s) 234, 236 are not substantially parallel to the corresponding vent 230, 232. The at least one inner shutter 234 may be held in the open position at an angle (e.g., angle 240 shown in FIG. 2B) of approximately 30°, 45°, 60°, 75°, 90°, or any other suitable angle from the inner vent 230, such that air may freely flow through the shutter(s) 234. In an example, the at least one inner shutter 234 may be held in the open position at an angle (240) less than approximately 60 degrees, or less than approximately 45 degrees, relative to the inner vent 230. The at least one outer shutter 236 may similarly be held in the open position at an angle (e.g., angle 242 shown in FIG. 2B) of approximately 30°, 45°, 60°, 75°, 90°, or any other suitable angle from the outer vent 232, such that air may freely flow through the shutter(s) 236. In an example, the at least one outer shutter 236 may be held in the open position at an angle (242) less than approximately 60 degrees, or less than approximately 45 degrees, relative to the outer vent 232. The angles 240 and 242 may be the same or different from each other. The inner shutter(s) 234 and the outer shutter(s) 236 may be maintained in their respective open positions to vent an electrical cabinet (e.g., enclosure 104 of FIG. 1) during normal operations of the electrical cabinet. FIG. 2A shows the inner and outer shutter(s) 234, 236 maintained in the open position, thereby allowing air to flow into the enclosure (shown by arrow 244) to cool down electrical equipment stored therein.

FIG. 2B illustrates the inner shutter(s) 234 and the outer shutter(s) 236 in a closed position. In a closed position, the inner shutter(s) 234 are substantially parallel to and completely cover the inner vent 230, and the outer shutter(s) 236 are substantially parallel to and completely cover the outer vent 232. This configuration of the inner and outer shutter(s) 234, 236 may restrict or prevent fluid communication between the interior and exterior of the enclosure. In some embodiments, "substantially parallel" may mean that the shutter(s) 234, 236 are completely parallel or aligned with their corresponding vents 230, 232. In other embodiments, "substantially parallel" may mean that the shutter(s) 234, 236 are aligned at an angle less than 5° from the corresponding vents 230, 232, but that air flow is substantially restricted by the shutter(s) 234, 236. In some embodiments, "substantially parallel" may mean that multiple shutters 234 (or multiple shutters 236) are aligned such that the shutter plates prevent air flow through the vent 230 (or vent 232). In some embodiments, multiple shutters 234 (or multiple shutters 236) in a closed position have no gaps between any two shutter plates in the group.

The inner shutter(s) 234 and the outer shutter(s) 236 are each configured to automatically transition from the open position to a closed position in response to an internal pressure rise. The inner shutter(s) 234 and the outer shutter(s) 236 may be configured such that the shutter plates automatically swivel, rotate, or pivot from an open position to a closed position upon a change in air pressure. Changes in air pressure within the enclosure may be indicative of an internal arc fault. For example, in the presence of an internal arc fault, if the air pressure in the enclosure becomes significantly greater than the air pressure outside the enclosure, the shutters 234, 236 will automatically transition from an open position to a closed position. As a result, harmful effects from an internal arc will be prevented from flowing out of the enclosure. The arc resistant shutter plate assemblies having the shutters 234, 236 may be configured such that the shutters 234, 236 transition from an open position to a close position without use of any force besides the increased air pressure on one side of the shutters 234, 236.

FIG. 2B shows the ventilation system 202 transitioning the at least one inner shutter 234 from the open position to the closed position in response to a rise in internal air pressure (e.g., in the enclosure). This increased air pressure in the enclosure is illustrated via an arrow 246 in FIG. 2B. The increased air pressure in the enclosure may be the result of an arc event (e.g., arc flash or arc fault). In addition, FIG. 2B shows the ventilation system 202 transitioning the at least one outer shutter 236 from the open position to the closed position in response to air pressure rise (e.g., in the air flow path 238). This increased air pressure in the air flow path 238 is illustrated via an arrow 248 in FIG. 2B. The inner shutter(s) 234 in the closed position may prevent a first portion (arrow 246) of air flow from escaping the enclosure. The outer shutter(s) 236 in the closed position may prevent at least part (arrow 248) of the remaining portion of air flow from escaping the enclosure. As such, the outer shutter(s) 236 provide redundant protection via their closure. By closing in response to a rise in the enclosure internal pressure, the shutters 234, 236 are able to protect nearby people and equipment from an arc event and redirect the flow of high pressure arc gases to an exhaust duct located in another part of the enclosure which is designed to vent the hot gases into a safe location.

Figure 3:
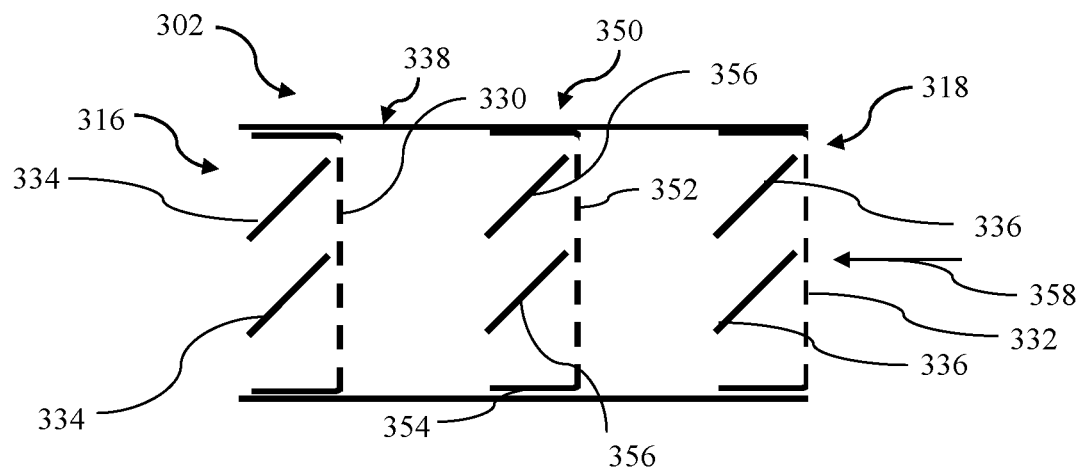
FIG. 3 is a schematic diagram illustrating a ventilation system having three shutter assemblies, in accordance with an embodiment of the present disclosure.

The present disclosure includes at least two individual shutters 234, 236, or two shutter assemblies, used to close off a path from inside to outside an enclosure upon pressure rise inside the enclosure exceeding a threshold. However, in other embodiments, there may be more than two individual shutters and/or shutter assemblies disposed along the air flow path 238 to close off the path. FIG. 3 shows one such example of a disclosed ventilation system 302 having three shutter assemblies.

Similar to FIG. 2, the ventilation system 302 of FIG. 3 may be used for an electrical equipment enclosure (e.g., 104 of FIG. 1). The ventilation system 302 includes an inner vent assembly 316 located at the interior of an enclosure, an outer vent assembly 318 located at the exterior of the enclosure, and an intermediate vent assembly 350 located between the inner and outer vent assemblies 316, 318.

The inner vent assembly 316 generally includes a first vent 330 ("inner vent") and at least one inner shutter 334. the outer vent assembly 318 generally includes a second vent 332 ("outer vent") and at least one outer shutter 336, and the intermediate vent assembly 350 generally includes a third vent 352 ("intermediate vent") and at least one intermediate shutter 356. The inner vent 330 may be disposed at an interior of the enclosure, the outer vent 332 may be disposed at an exterior of the enclosure, and the third vent 352 may be disposed along an air flow path 338 between the inner vent 330 and the outer vent 332.

The inner vent 330, outer vent 332, and/or intermediate vent 352 may include a construction similar to those described above with reference to the inner and outer vents 230, 232 of FIGS. 2A and 2B. The plate, wall, or similar surface having the intermediate vent 352 may form a portion of an intermediate housing 354 located inside the air flow path 338 or, alternatively, connecting two portions of the air flow path 338.

The inner shutter(s) 334, outer shutter(s) 336, and/or intermediate shutter(s) 356 may include a construction similar to those described above with reference to the inner and outer shutters 234, 236 of FIGS. 2A and 2B. The intermediate shutter(s) 356 shown in FIG. 3 may be held in an open position with respect to the intermediate vent 352 (e.g., at the same or a similar angle as the shutters 334 and 336). All three shutters 334, 336, 356 or shutter assemblies may be maintained in their respective open positions to vent an electrical cabinet during normal operations, thereby allowing air, shown as an arrow 358, to flow into the enclosure. In addition, all three shutters 334, 336, 356 are each configured to automatically transition from the open position to a closed position in response to air pressure in the enclosure rising. By closing in response to increased pressure in the enclosure, the shutters 334, 336, 356 are able to protect nearby people and equipment from an arc event and redirect the flow of high pressure arc gases. Any desired number of shutters or shutter assemblies may be used in a ventilation system according to the present disclosure. For example, a ventilation system may include two, three, four, five, six, seven, eight, or more intermediate vents 352 located along the air flow path 338 between the inner vent 330 and the outer vent 332, and a corresponding one or more shutters 356 located adjacent each of the intermediate vents 352.

Having described the general structure of the disclosed ventilation systems, a detailed example of such a ventilation system 102 will now be provided. FIGS. 4A-6C illustrate in detail the ventilation system 102 similarly shown in FIGS. 1A and 1B. It should be noted that other numbers, locations, arrangements, sizes, and orientations of the various vents, shutters, shutter plate assemblies, and flow paths may be used in other embodiments without departing from the scope of the present disclosure.

Referring to FIGS. 4A-6C, the inner vent assembly 116 generally includes an inner vent 130 and an inner shutter assembly 128, and the outer vent assembly 118 generally includes an outer vent 132 and an outer shutter assembly 129. The inner vent 130 and the outer vent 132 may take any form as described above with reference to the inner and outer vents 230, 232 of FIGS. 2A and 2B.

The inner shutter assembly 128 may include one or more inner shutters 134, and the outer shutter assembly 129 may include one or more outer shutters 136. In the illustrated embodiment of FIGS. 4A-6C, for example, the inner shutter assembly 128 includes two shutters 134, and the outer shutter assembly 129 includes one shutter 136. As such, it will be understood that different numbers of shutters may be present in different shutter assemblies. As illustrated, each shutter 134/136 may be a formed sheet metal part having a central, flat portion and two connecting portions 178/184 on opposite sides of the central, flat portion.

In addition to shutter(s) 134, the inner shutter assembly 128 may include at least one deformable segment 170 configured to facilitate transitioning the shutter(s) 134 from the open position to the closed position. Similarly, the outer shutter assembly 129 may also include at least one deformable segment 172 configured to facilitate transitioning the shutter(s) 136 from the open position to the closed position. In some embodiments, the deformable segments 170, 172 may each include a piece of material that may deform in response to the pressure inside the enclosure exceeding a predetermined threshold and pushing on the shutters 134, 136. Deforming the piece of material that makes up each deformable segment 170, 172 allows the corresponding shutter(s) 134, 136 to transition from the open position to the closed position.

As shown in FIGS. 4B and 5B-5D, the inner shutter assembly 128 may include other components, such as brackets 173 and end connectors 176. The brackets 173 may be mounted to an inside surface of the inner housing 120 along edges of the inner vent 130. The deformable segments 170 may be mounted to another inside surface of the inner housing 120. Each connecting portion 178 of the shutter 134 may be rotatably coupled to a bracket 173 and to an end connector 176. The opposing end connectors 176 are held to the inner housing via two deformable segments 170. As such, each inner shutter 134 may be held in the open position via the end connectors 176 and deformable segments 170. As the deformable segments 170 deform, the shutter 134 may rotate, with respect to the brackets 173 and the end connectors 176, from the open position to the closed position.

Figure 4A:
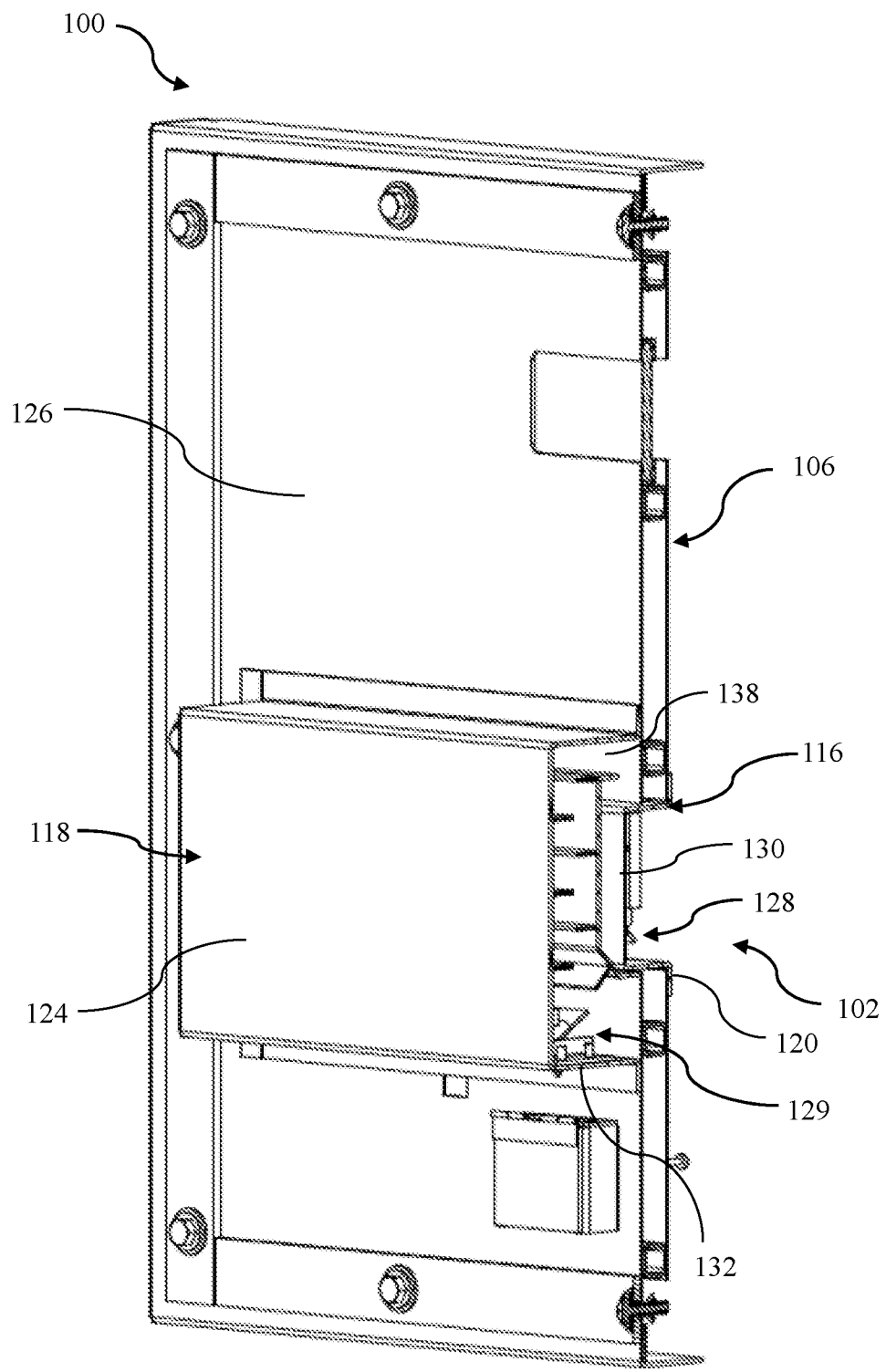
FIGS. 4A and 4B are perspective cutaway and side cutaway views, respectively, of a ventilation system for an electrical equipment enclosure, in accordance with an embodiment of the present disclosure.
Figure 4B:
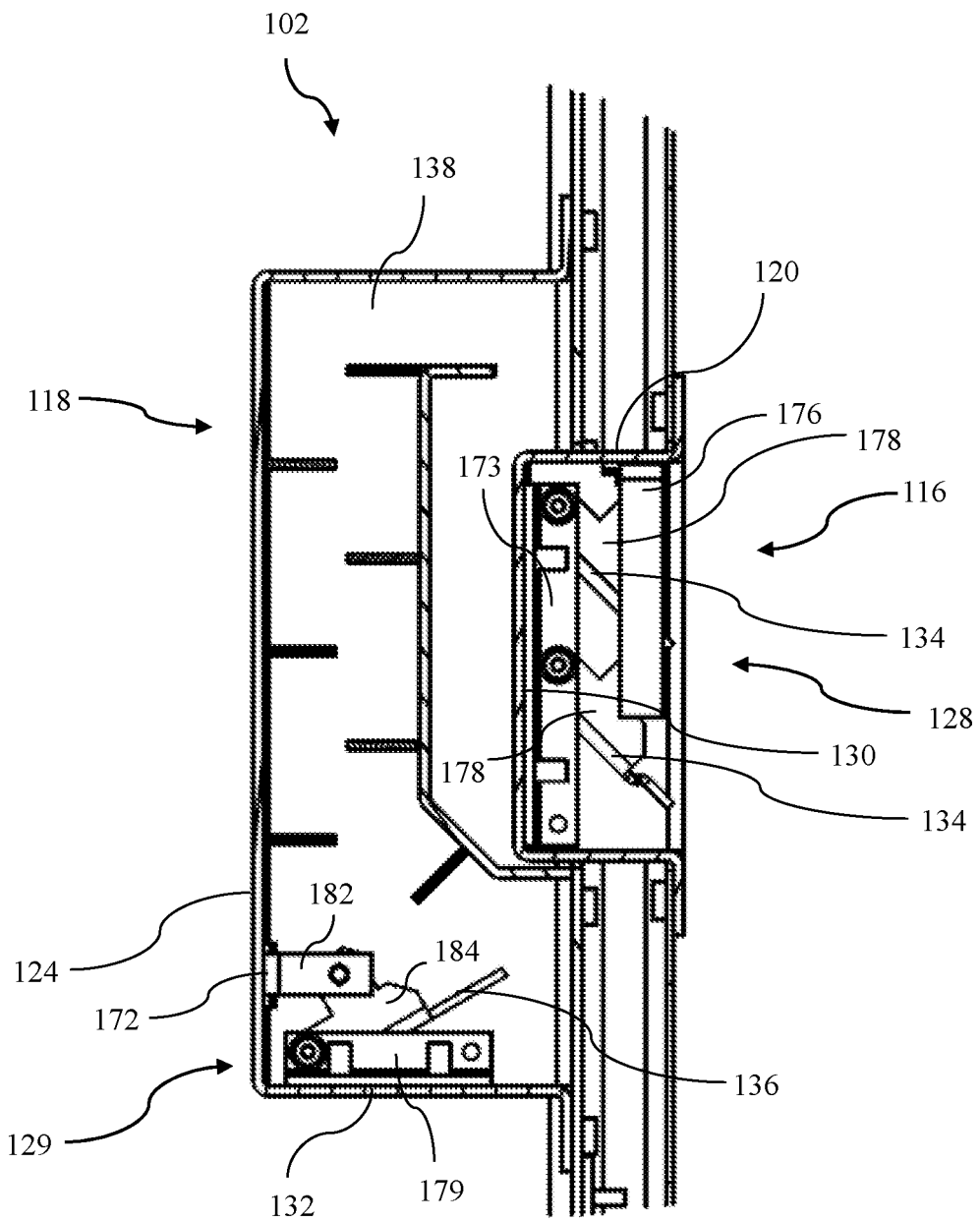
Figure 5A:
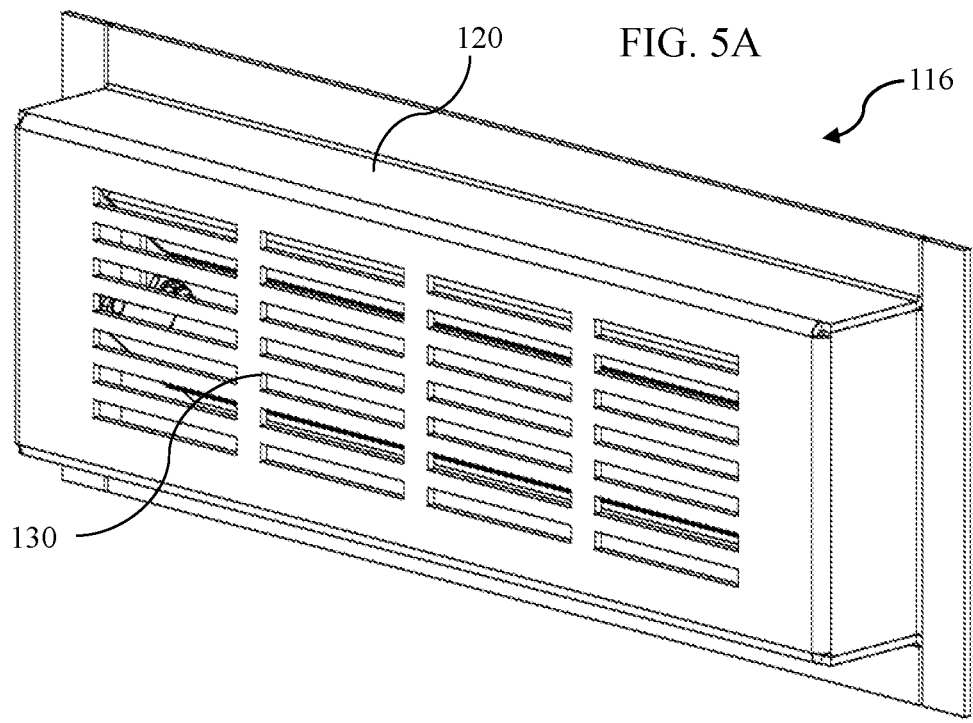
FIGS. 5A-5D are front perspective, back perspective, back, and side cutaway views, respectively of an inner vent assembly of the ventilation system of FIGS. 4A and 4B, in accordance with an embodiment of the present disclosure.
Figure 5B:
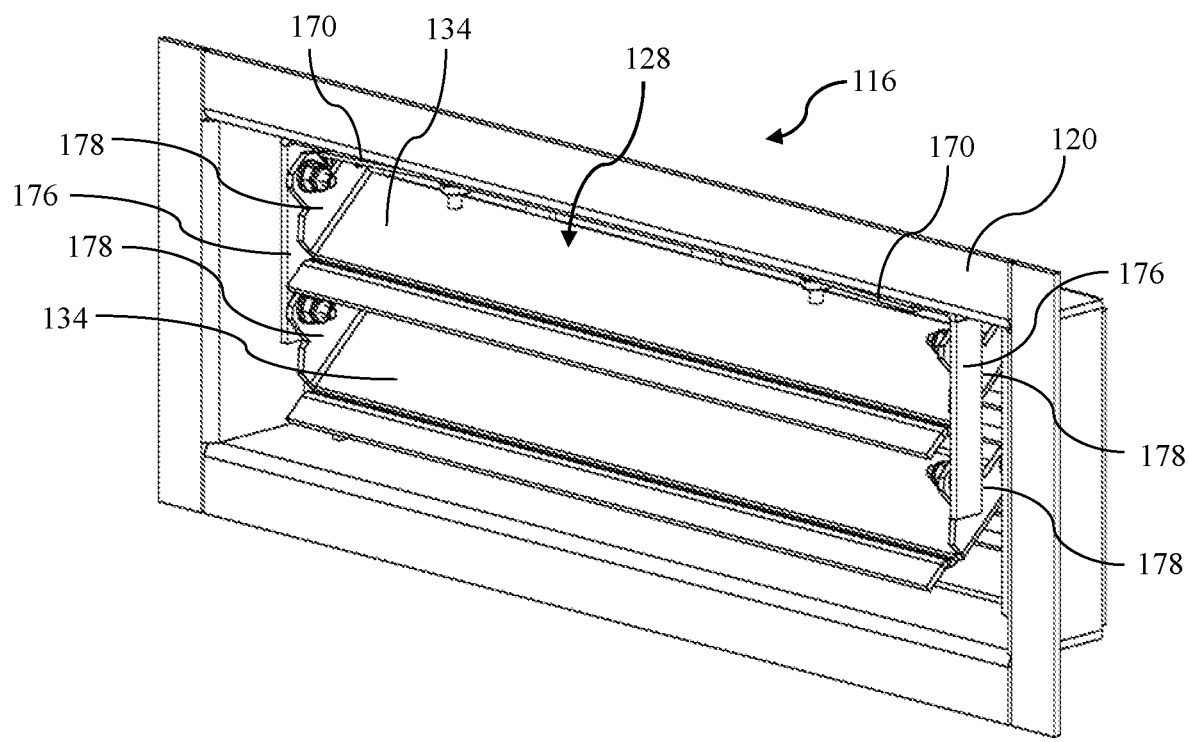
Figure 5C:
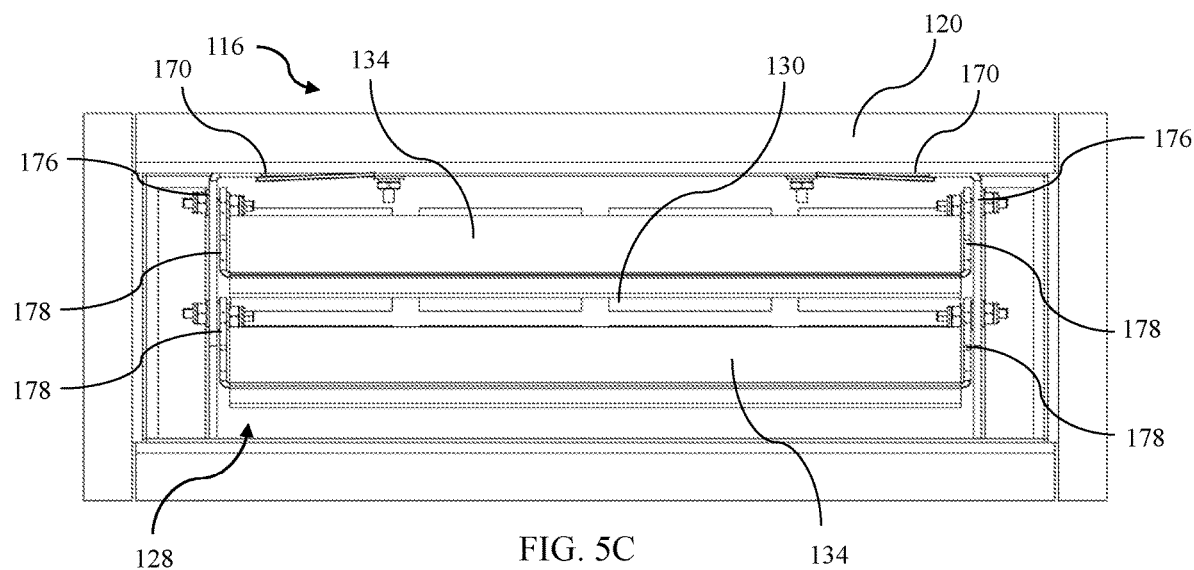
Figure 5D:
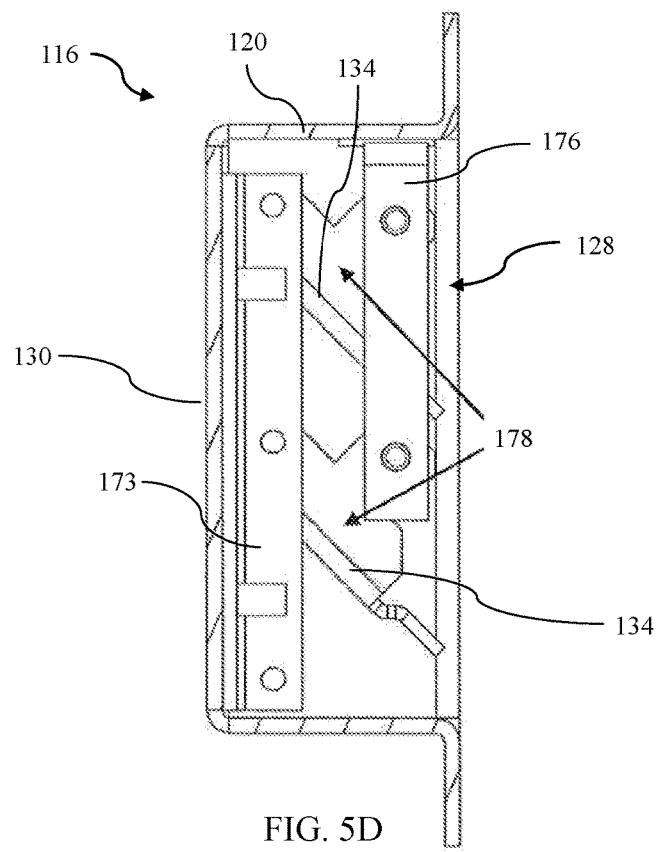

As shown in FIGS. 4B, 6B, and 6C, the outer shutter assembly 129 may include other components as well, such as brackets 179 and end connectors 182. The brackets 179 may be mounted to an inside surface of the outer housing 124 along edges of the outer vent 132. The deformable segments 172 may be mounted to another inside surface of the outer housing 124. Each connecting portion 184 of the shutter 136 may be rotatably coupled to a bracket 179 and to an end connector 182. The opposing end connectors 182 are held to the outer housing via two deformable segments 172. As such, each outer shutter 136 may be held in the open position via the end connectors 182 and deformable segments 172. As the deformable segments 172 deform, the shutter 136 may rotate, with respect to the brackets 179 and the end connectors 182, from the open position to the closed position.

The deformable segments 170, 172 may be constructed from aluminum, copper, brass, or a similarly soft metal that is capable of deforming in response to lower forces than the other components (e.g., brackets 173, 179; end connectors 176, 182) of the shutter assemblies 128, 129. These other components (e.g., brackets 173, 179; end connectors 176, 182) of the shutter assemblies 128, 129 may be constructed from steel or another harder metal that will not deform in response to the forces that may be exerted thereon by an arc event. The deformable segments 170, 172 maintain the corresponding shutters 134, 136 open during normal operations of the equipment in the enclosure 104, but may be deformed (enabling closure of the shutters 134, 136) in response to a relatively low force applied to the shutters 134, 136. In some embodiments, although not illustrated, the deformable segments 170, 172 may include one or more cutouts formed therein that aid in the deformation of the material in response to a relatively low force applied to the shutters 134, 136. In some embodiments, the deformable segments 170, 172 may be constructed from one piece of material, with the deformable segments 170, 172 having smaller dimensions and/or cutouts that facilitate deformation of the deformable segments 170, 172 to close the shutter assembly.

As shown in FIGS. 5A-5D, the inner vent assembly 116 may include an inner housing 120 having the inner vent 130 formed therein, and the inner shutters 134 are located inside the inner housing 120. The inner housing 120 may be mounted to an interior of an enclosure (e.g., 104), as shown in FIG. 1B. As shown in FIGS. 6A-6C, the outer vent assembly 118 may include an outer housing 124 having the outer vent 132 formed therein, and the outer shutter 136 is located inside the outer housing 124. The outer housing 124 may be mounted to an exterior surface of the enclosure (e.g., 104), as shown in FIG. 1A. As shown in FIGS. 4A and 4B, the inner housing 120 may be at least partially enclosed within the outer housing 124. This may reduce the overall footprint of the ventilation system 102 installed in an enclosure.

As shown in FIGS. 4B and 6A-6C, the outer vent assembly 118 may be arranged such that the outer vent 132 is on a downward facing edge of the exterior of the enclosure (e.g., 104 of FIGS. 1A and 1B) in which the ventilation system 102 is installed. More specifically, the outer vent 132 may form a downward facing surface of the outer housing 124 on the enclosure. This helps to redirect any flames or hot gases that escape the outer vent 132 (while the ventilation system is closing) away from anyone present outside the enclosure.

As discussed above, the inner vent assembly 116 and the outer vent assembly 118 may be separated from each other along an air flow path 138. In some embodiments, as shown for example in FIG. 4B, the air flow path 138 is a circuitous air flow path between the inner vent 130 and the outer vent 132. As shown in FIG. 4B, the ventilation system 102 may include multiple fins, baffles, walls, bends, or a combination thereof along the circuitous air flow path 138 to redirect air flow as pressurized gases move from the inner vent 130 to the outer vent 132. As discussed above with reference to FIG. 2B, the inner shutters 134 may be closed in response to pressurized air flow to prevent a first portion of air flow from escaping the enclosure. A remaining portion of air flow that escapes the inner vent 130 during closure of the ventilation system 102 may be routed through the circuitous air flow path 138. The fins, baffles, walls, bends, etc. may reduce the energy of this remaining portion of air flow moving through the circuitous air flow path 138. This may reduce the amount of any remaining portion of air that escapes the enclosure through the outer vent 132. In embodiments having more than two vent assemblies (as discussed above with reference to FIG. 3), the air flow path may be circuitous on both sides of an intermediate vent assembly.

The circuitous air flow path 138 of FIGS. 4B and 6A-6C provides an extended flame path that reduces the chance of flames escaping the enclosure in response to an arc event. If effects of an arc event move past the inner vent 130, the gasses and flames are forced to travel through the baffled circuitous path, as shown by arrows 190 in FIG. 6B, ultimately taking a longer path to reach the outside atmosphere and losing energy along the way. The extended, circuitous path does not impede ventilation of the equipment contained in the enclosure, as it provides a path for convective cooling. It may be desirable to increase or maximize the length of the circuitous air flow path 138, where dimensional constraints allow, so as to further reduce the energy of gases or flames that threaten to escape the enclosure while the ventilation system 102 is closing. As illustrated in FIGS. 4B, 6B, and 6C, the circuitous air flow path 138 may be formed entirely within the outer housing 124 having the outer vent 132. This provides an efficient use of available space within the ventilation system 102 and ultimately a longer air flow path 138 than would be available without incorporating it into the outer housing 124.

Although the present disclosure and its advantages have been described in detail, it should be understood that various changes, substitutions and alterations can be made herein without departing from the spirit and scope of the disclosure as defined by the following claims.

What is claimed is:

1. A ventilation system for an electrical equipment enclosure, comprising:
a first vent disposed at an interior of the enclosure;
a second vent disposed at an exterior of the enclosure and located away from the first vent along an air flow path;
at least one inner shutter held in an open position with respect to the first vent;
a pair of brackets disposed adjacent to the first vent on opposing sides of the enclosure;
a pair of end connectors disposed laterally offset from the pair of brackets and further into the interior of the enclosure on the opposing sides of the enclosure, wherein each end of the at least one inner shutter is rotatably coupled to one of the pair of brackets and one of the pair of end connectors; and
at least one outer shutter held in an open position with respect to the second vent;
the at least one inner shutter and the at least one outer shutter each being configured to automatically transition from the open position to a closed position in response to air pressure increase in the enclosure.

2. The ventilation system of claim 1, wherein:
the at least one inner shutter comprises a deformable segment configured to facilitate transitioning the at least one inner shutter from the open position to the closed position; and
the at least one outer shutter comprises a deformable segment configured to facilitate transitioning the at least one outer shutter from the open position to the closed position.

3. The ventilation system of claim 1, further comprising:
a third vent disposed along the air flow path between the first vent and the second vent; and
at least one intermediate shutter held in an open position with respect to the third vent, the at least one intermediate shutter being configured to automatically transition from an open position to a closed position in response to air pressure increase.

4. The ventilation system of claim 1, wherein the second vent is on a downward facing edge of the exterior of the enclosure.

5. The ventilation system of claim 1, wherein the air flow path is a circuitous air flow path between the first vent and the second vent.

6. The ventilation system of claim 5, further comprising multiple fins, baffles, walls, bends, or a combination thereof to redirect air flow along the circuitous path.

7. The ventilation system of claim 1, further comprising:
an inner housing mounted to the interior of the enclosure and having the first vent, wherein the at least one inner shutter is inside the inner housing; and
an outer housing mounted to the exterior of the enclosure and having the second vent, wherein the at least one outer shutter is inside the outer housing.

8. The ventilation system of claim 7, wherein the inner housing is at least partially enclosed within the outer housing.

9. The ventilation system of claim 1, wherein:
the at least one inner shutter is held in the open position at an angle less than 60 degrees relative to the first vent; and
the at least one outer shutter is held in the open position at an angle less than 60 degrees relative to the second vent.

10. An electrical equipment system, comprising:
an enclosure;
electrical equipment contained in the enclosure;
a first vent disposed at an interior of the enclosure;
a second vent disposed at an exterior of the enclosure and located away from the first vent along an air flow path;
at least one inner shutter held in an open position with respect to the first vent;
a pair of brackets disposed adjacent to the first vent on opposing sides of the enclosure;
a pair of end connectors disposed laterally offset from the pair of brackets and further into the interior of the enclosure on the opposing sides of the enclosure, wherein each end of the at least one inner shutter is rotatably coupled to one of the pair of brackets and one of the pair of end connectors; and at least one outer shutter held in an open position with respect to the second vent;

the at least one inner shutter and the at least one outer shutter each being configured to automatically transition from the open position to a closed position in response to air pressure increase in the enclosure.

11. The electrical equipment system of claim 10, wherein the enclosure comprises a door, and wherein the first vent is disposed at an interior of the door and the second vent is disposed at an exterior of the door.

12. The electrical equipment system of claim 10, wherein the enclosure comprises a power components cabinet for a medium-voltage control center, switchgear, or adjustable speed drive.

13. A method comprising:
providing a ventilation system for an electrical equipment enclosure, the ventilation system comprising:
a first vent disposed at an interior of the enclosure;
a second vent disposed at an exterior of the enclosure and located away from the first vent along an air flow path;
at least one inner shutter held in an open position with respect to the first vent;
a pair of brackets disposed adjacent to the first vent on opposing sides of the enclosure;
a pair of end connectors disposed laterally offset from the pair of brackets and further into the interior of the enclosure on the opposing sides of the enclosure, wherein each end of the at least one inner shutter is rotatably coupled to one of the pair of brackets and one of the pair of end connectors; and
at least one outer shutter held in an open position with respect to the second vent; and
maintaining the at least one inner shutter in the open position and the at least one outer shutter in the open position to vent the electrical cabinet,
transitioning automatically the at least one inner shutter and the at least one outer shutter from the open position to a closed position in response to air pressure in the enclosure increasing.

14. The method of claim 13, further comprising:
deforming a piece of material of the at least one inner shutter to transition the at least one inner shutter from the open position to the closed position; and
deforming a piece of material of the at least one outer shutter to transition the at least one outer shutter from the open position to the closed position.

15. The method of claim 13, further comprising:
preventing a first portion of air flow from escaping the enclosure via the at least one inner shutter in the closed position; and
preventing at least part of a remaining portion of air flow from escaping the enclosure via the at least one outer shutter in the closed position.

16. The method of claim 15, further comprising routing the remaining portion of the air flow through a circuitous path between the first vent and the second vent.

17. The method of claim 16, further comprising reducing an energy of the remaining portion of the air flow through the circuitous path via fins, baffles, walls, bends, or a combination thereof.

18. The method of claim 13, wherein the ventilation system further comprises:
a third vent disposed along the air flow path; and
at least one intermediate shutter held in an open position with respect to the third vent.

19. The method of claim 13, wherein the ventilation system further comprises:
an inner housing having the first vent, wherein the at least one inner shutter is inside the inner housing; and
an outer housing having the second vent, wherein the at least one outer shutter is inside the outer housing.

* * * * *